(12) United States Patent
Kikuchi

(10) Patent No.: US 8,545,158 B2
(45) Date of Patent: Oct. 1, 2013

(54) LOADING UNIT AND PROCESSING SYSTEM

(75) Inventor: Hiroshi Kikuchi, Oshu (JP)

(73) Assignee: Tokyo Electron Limited, Minato-Ku (JP)

(*) Notice: Subject to any disclaimer, the term of this patent is extended or adjusted under 35 U.S.C. 154(b) by 0 days.

(21) Appl. No.: 13/438,258

(22) Filed: Apr. 3, 2012

(65) Prior Publication Data

US 2012/0257948 A1 Oct. 11, 2012

(30) Foreign Application Priority Data

Apr. 7, 2011 (JP) ................................. 2011-085205

(51) Int. Cl.
*B65G 25/00* (2006.01)

(52) U.S. Cl.
USPC ............ 414/150; 414/152; 414/172; 414/191

(58) Field of Classification Search
USPC .................. 414/150, 152, 172, 191
See application file for complete search history.

(56) References Cited

U.S. PATENT DOCUMENTS

| | | | |
|---|---|---|---|
| 5,447,294 A | 9/1995 | Sakata et al. | |
| 5,645,391 A * | 7/1997 | Ohsawa et al. | 414/416.03 |
| 6,409,503 B1 | 6/2002 | Yoshida et al. | |
| 6,852,601 B2 | 2/2005 | Yoshida et al. | |

FOREIGN PATENT DOCUMENTS

| | | |
|---|---|---|
| JP | 02-130925 A1 | 5/1990 |
| JP | 06-224143 A1 | 8/1994 |
| JP | 2001-093851 A1 | 4/2001 |
| JP | 2007-027772 A1 | 2/2007 |

* cited by examiner

*Primary Examiner* — Saul Rodriguez
*Assistant Examiner* — William Berry, Jr.
(74) *Attorney, Agent, or Firm* — Burr & Brown

(57) ABSTRACT

A loading unit avoiding the need to enhance the performance of a lifting elevator mechanism, thus preventing an increase in the cost of the lifting elevator mechanism. The loading unit is configured to vertically move a substrate holder, holding a plurality of substrates, into and out of a cylindrical processing container upon heat treatment of the substrates. The loading unit includes: a lifting elevator mechanism for holding and vertically moving the substrate holder and a cap; and a pressing mechanism, having a piezoelectric actuator, for upwardly pressing against the cap lying at a bottom opening of the processing container.

6 Claims, 12 Drawing Sheets

LOADING UNIT AND PROCESSING SYSTEM

CROSS-REFERENCE TO RELATED APPLICATION

This application claims the priority benefit of Japanese Patent Application No. 2011-085205, filed on Apr. 7, 2011, the disclosure of which is incorporated herein by reference in its entirety.

FIELD OF THE INVENTION

The present invention relates to a processing system for performing heat treatment of a substrate, such as a semiconductor wafer, and to a loading unit for use in the processing system.

BACKGROUND OF THE INVENTION

In the manufacturing of a semiconductor integrated circuit such as IC or LSI, a substrate such as a semiconductor wafer is generally subjected to various heat treatments, including film forming processing, oxidation/diffusion, etching, annealing, the formation of a silicon oxide film, sintering, etc. A vertical batch-type heat treatment apparatus is used to process a plurality of substrates at a time, as described in patent documents 1 to 4.

In an exemplary heat treatment apparatus, a wafer boat loaded with a plurality of, e.g. about 100 to 150, substrates (semiconductor wafers) is raised by means of a lifting elevator mechanism to load (insert) the wafer boat into a vertical quartz processing container from a loading chamber having an inert gas atmosphere, disposed below the processing container. Thereafter, the bottom opening of the processing container is hermetically closed by a cap having an O-ring, and heat treatment, such as film forming processing, is carried out in the hermetically-closed processing container. After the heat treatment, the wafer boat is unloaded (lowered), and transfer of substrates is performed to replace the processed substrates in the wafer boat with unprocessed substrates. The same heat treatment is then repeated.

A boat elevator, provided in the loading chamber, may be used to vertically move the wafer boat. The transfer of substrates may be performed by means of a transfer mechanism provided in the loading chamber.

<Prior Art Documents>

Patent document 1: Japanese Patent Laid-Open Publication No. H02-130925
Patent document 2: Japanese Patent Laid-Open Publication No. H06-224143
Patent document 3: Japanese Patent Laid-Open Publication No. 2001-093851
Patent document 4: Japanese Patent Laid-Open Publication No. 2007-027772

As described above, the bottom opening of the processing container is hermetically closed by the cap during heat treatment. Further, in order to enhance the sealing performance, the lifting elevator mechanism continually presses on the cap with a predetermined force during heat treatment.

On the lifting elevator mechanism are applied both the load of the wafer boat containing substrates and the load of the internal pressure acting on the cap. The load of the internal pressure is considerably large during a heat treatment, such as sintering, which is carried out at a processing pressure higher than atmospheric pressure. Thus, such a heat treatment necessitates a lifting elevator mechanism having a reinforced structure and a powerful drive motor, leading to an increased apparatus cost.

To increase the efficiency of production of semiconductor integrated circuits, substrates are expected to have a larger diameter. For example, there is a demand for increasing a substrate diameter from 300 mm to 450 mm. The load of a wafer boat, holding 150 such large-diameter substrates, will be about 400 kg. In addition, the increase in substrate diameter requires an increase in the area of a cap for closing the opening of a processing container. When performing a heat treatment at a processing pressure higher than atmospheric pressure, the increase in the area of the cap leads to an increase in the load of internal pressure. This necessitates the use of a lifting elevator mechanism having a reinforced structure, resulting in an increased cost.

SUMMARY OF THE INVENTION

The present invention has been made in view of the above situation and in order to solve the above problems. It is therefore an object of the present invention to provide a loading unit and a processing system which, besides a lifting elevator mechanism for vertically moving a substrate holder, use a pressing mechanism having a piezoelectric actuator in order to press on a cap, and can thereby avoid the need to enhance the performance of the lifting elevator mechanism, thus preventing an increase in the cost of the lifting elevator mechanism.

In order to achieve the object, the present invention provides a loading unit for housing a substrate holder for holding a plurality of substrates and a cap for supporting the substrate holder, and vertically moving the substrate holder and the cap into and out of a cylindrical processing container having a bottom opening to be closed by the cap, said loading unit comprising: a lifting elevator mechanism for holding and vertically moving the substrate holder and the cap; and a pressing mechanism, having a piezoelectric actuator, for upwardly pressing against the cap lying at the bottom opening of the processing container.

By using, in addition to the lifting elevator mechanism, the pressing mechanism having a piezoelectric actuator to press on the cap, it becomes possible to avoid the need to enhance the performance of the lifting elevator mechanism, thus preventing an increase in the cost of the lifting elevator mechanism.

The present invention also provides a processing system comprising: a processing unit for carrying out heat treatment of a substrate; a loading unit provided below the processing unit; and a stocker unit, provided side by side with the loading unit, for stocking a substrate container in which a plurality of substrates are housed, wherein said loading unit is for housing a substrate holder for holding a plurality of substrates and a cap for supporting the substrate holder, and vertically moving the substrate holder and the cap into and out of a cylindrical processing container having a bottom opening to be closed by the cap, said loading unit comprising: a lifting elevator mechanism for holding and vertically moving the substrate holder and the cap; and a pressing mechanism, having a piezoelectric actuator, for upwardly pressing against the cap lying at the bottom opening of the processing container.

The loading unit and the processing system according to the present invention can achieve the following advantageous effects: In addition to the lifting elevator mechanism for vertically moving the substrate holder, the pressing mechanism, having a piezoelectric actuator, for pressing on the cap is provided in the loading unit configured to vertically move the substrate holder, holding a plurality of substrates, into and out of the cylindrical processing container upon heat treatment of the substrates. This can avoid the need to enhance the performance of the lifting elevator mechanism, thus preventing an increase in the cost of the lifting elevator mechanism.

DETAILED DESCRIPTION OF THE INVENTION

Figure 1:
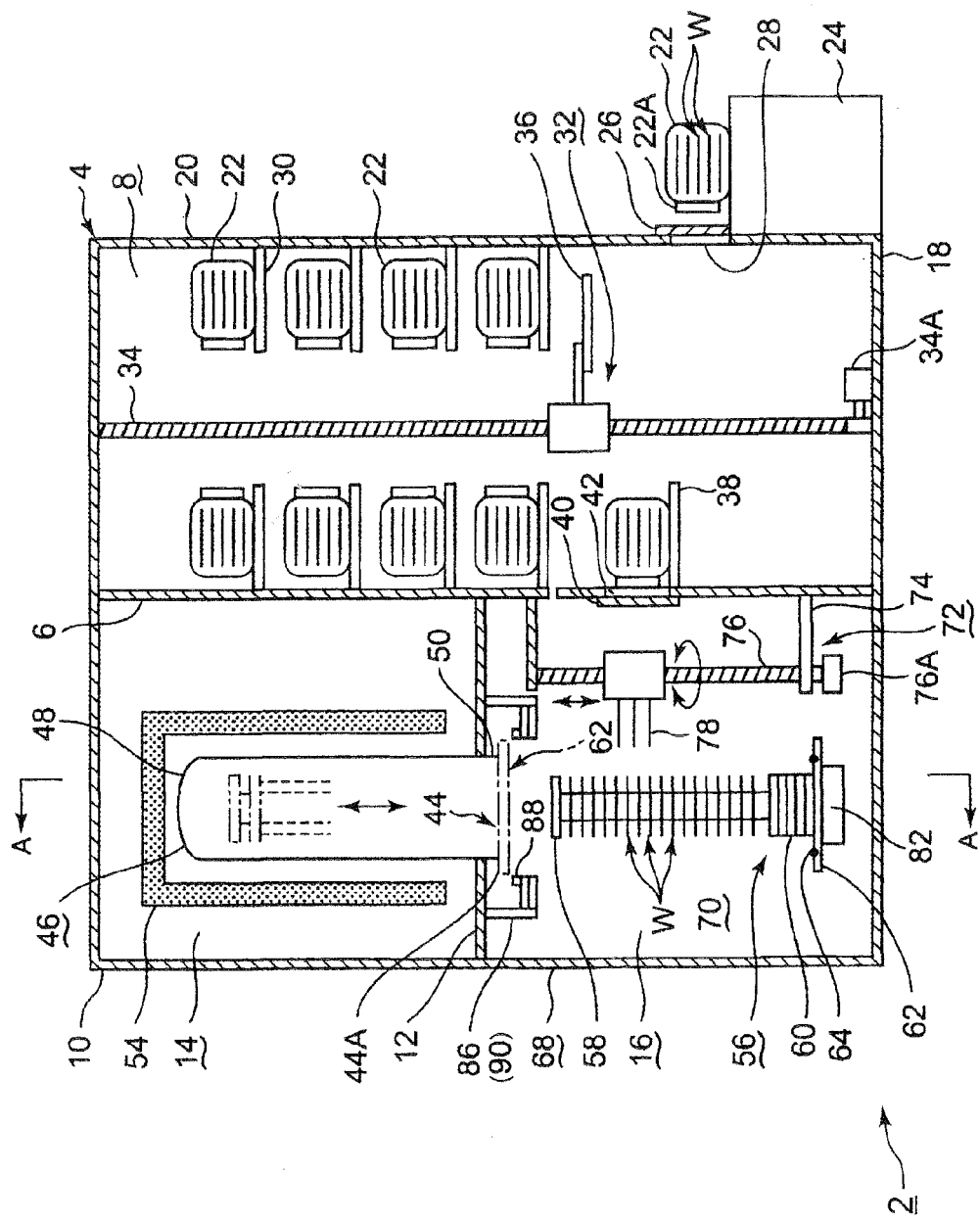
FIG. 1 is a cross-sectional view showing the entire processing system having a loading unit according to the present invention.
Figure 2:
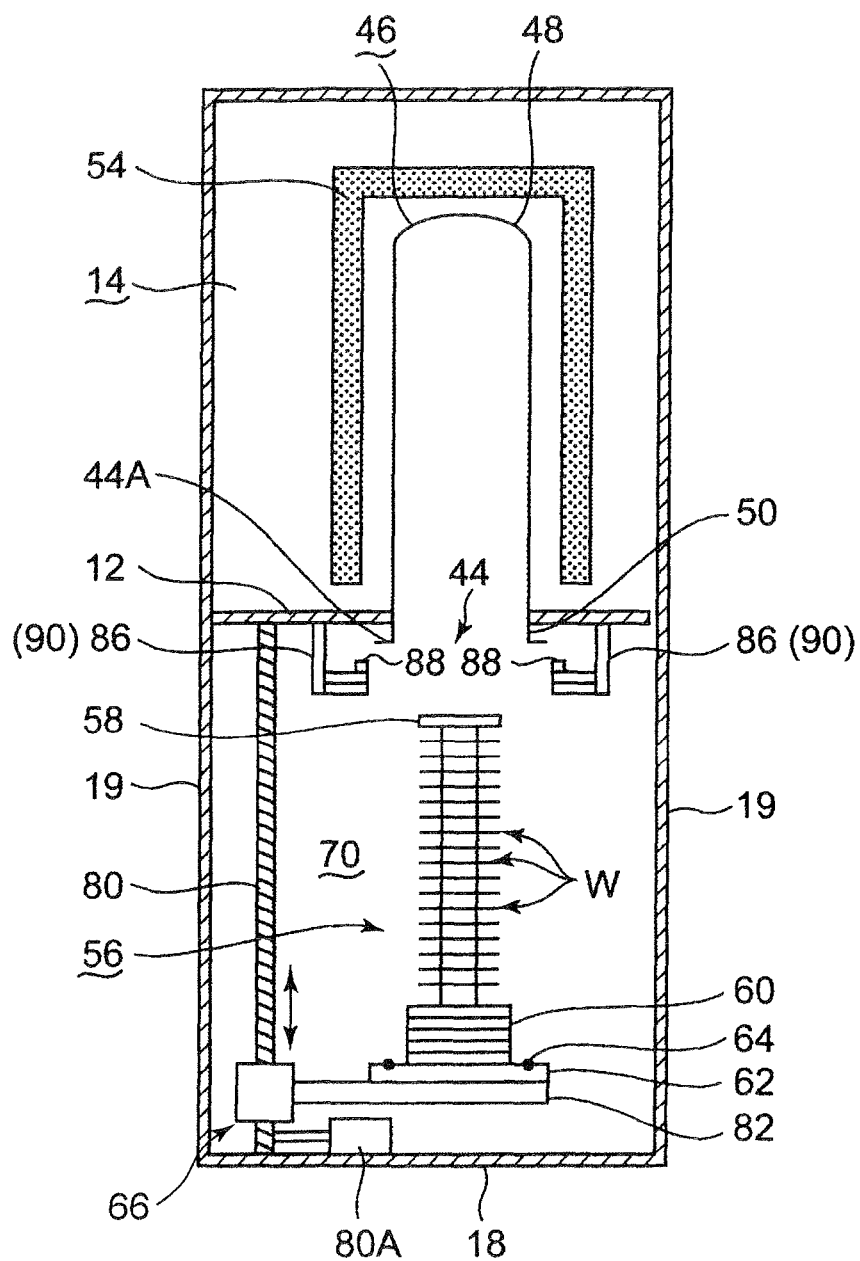
FIG. 2 is a cross-sectional view taken along the line A-A of FIG. 1.
Figure 3:
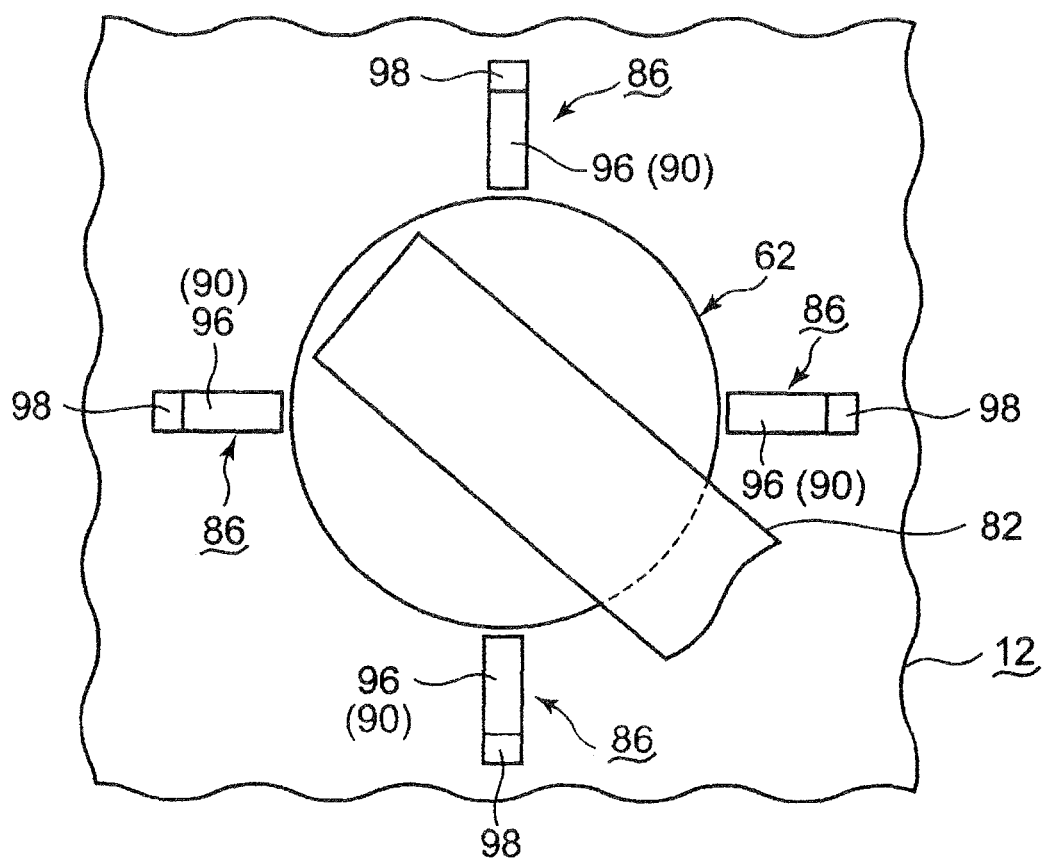
FIG. 3 is a bottom view showing the positional relationship between a raised cap and a pressing mechanism.
Figure 4:
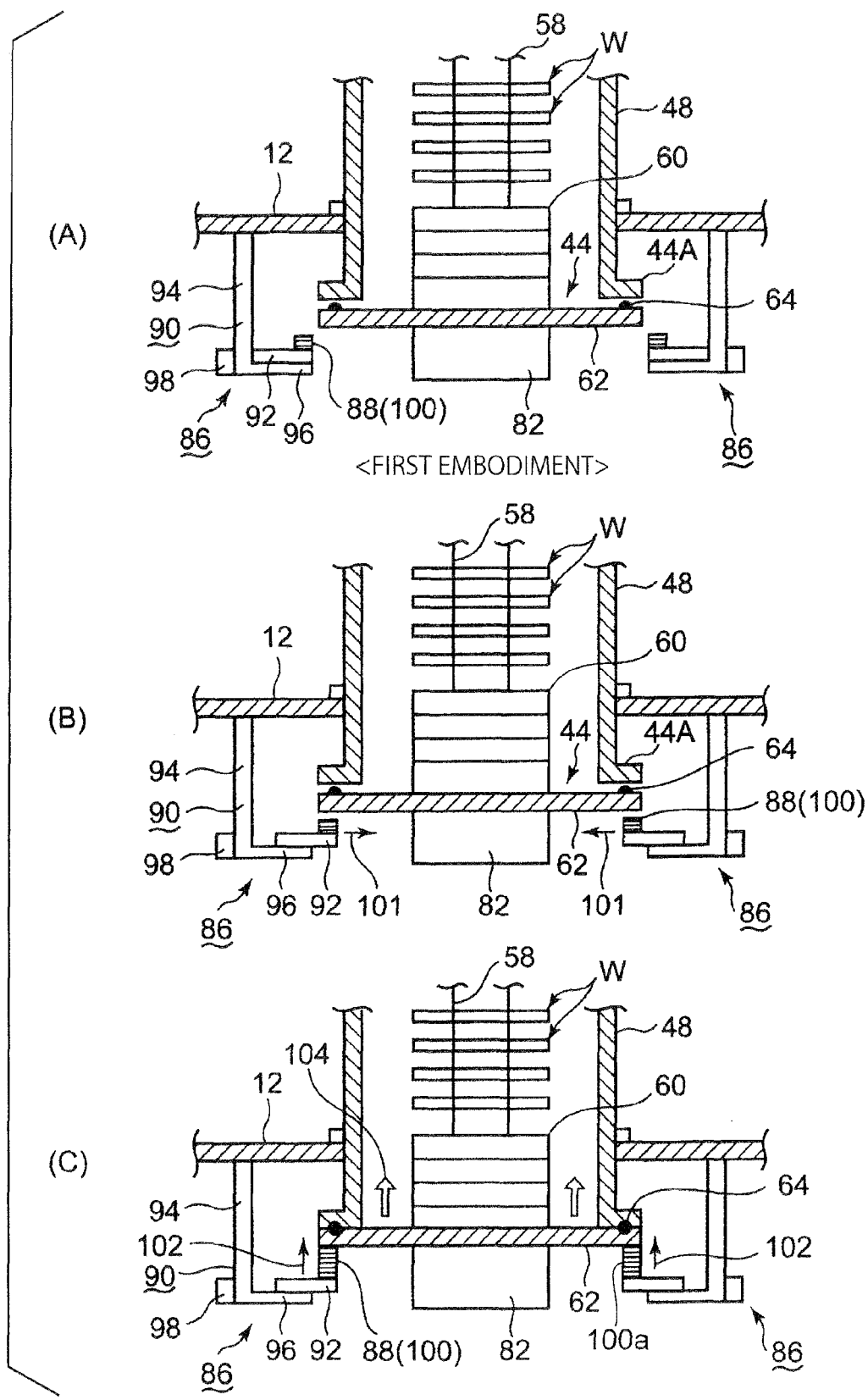
FIGS. 4(A) through 4(C) are diagrams illustrating the operation of a pressing mechanism according to a first embodiment.
Figure 5:
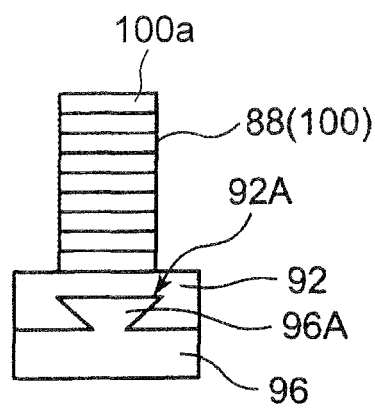
FIG. 5 is an enlarged plan view showing an example of the front end of a pressing mechanism.

Preferred embodiments of the loading unit and the processing system according to the present invention will now be described with reference to the drawings. FIG. 1 is a cross-sectional view showing the entire processing system having a loading unit according to the present invention; FIG. 2 is a cross-sectional view taken along the line A-A of FIG. 1; FIG. 3 is a bottom view showing the positional relationship between a raised cap and a pressing mechanism; FIGS. 4(A) through 4(C) are diagrams illustrating the operation of a pressing mechanism according to a first embodiment; and FIG. 5 is an enlarged plan view showing an example of the front end of the pressing mechanism.

As shown in FIGS. 1 and 2, the entire processing system 2 is installed on a floor surface in a clean room in which a downward flow of clean air is formed. The processing system 2 has a large chassis 4, e.g. made of stainless steel, as an exterior frame.

A vertical central compartment wall 6, e.g. made of stainless steel, is provided in the interior of the chassis 4, defining a stocker unit 8 on the front side (the right side in FIG. 1) of the interior. A horizontally-extending base plate 12, e.g. made of stainless steel, is provided as a compartment wall between the central compartment wall 6 and a rear compartment wall 10 of the chassis 4, defining a processing unit 14 on the upper side and a loading unit 16 on the lower side. The loading unit 16 and the stocker unit 8 are thus provided side by side.

The load of the entire processing system 2 is supported by a bottom compartment wall 18 which defines the bottom of the chassis 4. A carry-in/carry-out port 24 for placing thereon a substrate container 22 in which a plurality of substrates W such as semiconductor wafers are housed, is provided on a lower portion of the front compartment wall 20 of the stocker unit 8. An openable/closable lid 22A is mounted at the front of the substrate container 22. A carry-in/carry-out opening 28, which can be opened and closed by a door 26, is provide in the front compartment wall 20 at a position corresponding to the carry-in/carry-out port 24 so that the substrate container 22 can be carried into and out of the stocker unit 8.

A cassette or an airtight container called FOUP (registered trademark), which can house a plurality of, e.g. about 25, substrates W, can be used as the substrate container 22. In this embodiment is used an airtight container which contains an inert gas, such as $N_2$ gas, to prevent oxidation of substrates W.

Stock shelves 30, arranged in multiple steps in the vertical direction, are provided in the stocker unit 8. Substrate containers 22, each housing processed or unprocessed substrates W, are placed on the stock shelves 30 for temporary storage. The stocker unit 8 is provided with a container transfer mechanism 32 which includes an upright guide rail 34, and a container transport arm 36 which moves vertically along the guide rail 34. The guide rail 34 includes a ball screw which is driven e.g. by a drive motor 34A. The container transport arm 36 is configured to be horizontally foldable and rotatable in a horizontal plane so that a substrate container 22 can be transferred between the carry-in/carry-out port 24 and each of the stock shelves 30.

The stocker unit 8 is also provided with a container transfer port 38 mounted to the central compartment wall 6 and on which a substrate container 22 can be placed. A substrate container 22 is transported between the container transfer port 38 and each stock shelf 30 or the carry-in/carry-out port 24 by means of the container transfer mechanism 32.

The central compartment wall 6, to which the container transfer port 38 is mounted, has a substrate carry-in/carry-out opening 42 which can be opened and closed by a door 40, so that substrates W can be transferred between the container transfer port 38 and the loading unit 16 via the substrate carry-in/carry-out opening 42. A downward flow of clean air is formed in the stocker unit 8.

A cylindrical processing container 46 having a bottom opening 44 is provided in the processing unit 14. The processing container 46 includes a container body 48, e.g. made of quartz which is heat resistant and corrosion resistant, and a manifold 50, e.g. made of stainless steel, provided at the lower end of the container body 48. The opening 44 is formed at the bottom of the manifold 50, and a flange portion 44A is formed around the opening 44. The processing container 46, at a lower portion, is supported by the base plate 12. The base plate 12 thus supports the load of the processing container 46.

A cylindrical heater section 54 is provided around the processing container 46 concentrically to heat substrates housed in the processing container 46. To the side wall of the manifold 50 of the processing container 46 are connected a gas supply system (not shown) for supplying a gas (gases) necessary for heat treatment and an evacuation system (not shown) for evacuating the atmosphere from the interior of the processing container 46 while controlling the internal pressure. The processing container 46 is configured to be capable of housing a substrate holder 56 in which substrates W are held in multiple stages.

The substrate holder 56 includes a quartz wafer boat 58 for supporting substrates W in multiple stages at a predetermined pitch, and a quartz heat-retaining cylinder 60, provided under the wafer boat 58, for maintaining the temperatures of the wafers W while supporting the wafer boat 58. The heat-retaining cylinder 60 is supported rotatably or fixedly on a cap 62, e.g. made of stainless steel, for closing the opening 44 of the processing container 46. A sealing member 64, such as an O-ring, is interposed between a periphery portion of the cap 62 and the lower end of the manifold 50 so that the processing container 46 can be hermetically closed. The substrate holder 56 can be moved up and down by means of a lifting elevator mechanism 66 (see FIG. 2) provided in the loading unit 16. When the diameter of the substrates W is 450 mm, the diameter of the cap 62 is about 600 to 650 mm.

The loading unit 16 has a loading chassis 68 as an exterior frame, internally defining a hermetically closed loading chamber 70. In particular, referring to FIG. 1, the loading chamber 70 is defined by the base plate 12, the lower portion of the rear compartment wall 10, the lower portion of the central compartment wall 6, the left-side portion of the bottom compartment wall 18 and the lower portion of the side compartment wall 19 (see FIG. 2) of the chassis 4, which form the loading chassis 68.

The loading chassis 68 thus connects to the bottom of the processing unit 14. The base plate 12 also serves as a compartment wall that defines the processing unit 14, and the central compartment wall 6 also serves as a compartment wall that defines the stocker unit 8.

A substrate transfer mechanism 72 for transferring a substrate W to and from the wafer boat 58 of the substrate holder 56 is provided between the substrate holder 56 in a lowered position just below the processing container 46 and the container transfer port 38 of the stocker unit 8. The substrate transfer mechanism 72 includes an upright guide rail 76 which is supported, at the upper and lower ends, by fixing arm portions 74 extending from the central compartment wall 6, and transfer arms 78 which move vertically along the guide rail 76. The guide rail 76 includes a ball screw which is driven e.g. by a drive motor 76A. The transfer arms 78 are configured to be pivotable and foldable in a horizontal plane so that a plurality of substrates W can be transferred at a time between the wafer boat 58 and the substrate container 22 placed on the container transfer port 38.

As shown in FIG. 2, the lifting elevator mechanism 66 for vertically moving the substrate holder 56 includes an upright guide rail 80, and a holding arm 82 which moves vertically along the guide rail 80. The guide rail 80 includes a ball screw which is driven e.g. by a drive motor 80A. In this embodiment the upper end of the guide rail 80 is secured to the base plate 12, and the lower end of the guide rail 80 is secured to the bottom compartment wall 18.

The holding arm 82 extends horizontally, and supports and holds the bottom of the substrate holder 56. A box-shaped scavenger (not shown) is provided around the lower end of the processing container 46 in order to prevent the exhaust heat in the interior of the processing container 46 from flowing into the loading chamber 70.

The loading unit 16 is provided with pressing mechanisms 86, which are characteristic of the present invention, for upwardly pressing on the cap 62 lying at the bottom opening 44 of the processing container 46. As shown in FIG. 3, a plurality of, e.g. four as depicted, pressing mechanisms 86 are provided along the circumferential direction of the processing container 46, i.e. of the cap 62. The number of the pressing mechanisms 86 is not particularly limited insofar as it is not less than three.

The pressing mechanisms 86 each have a piezoelectric actuator 88 which uses a piezoelectric element. More specifically, each pressing mechanism 86 includes a fixed arm portion 90, a slide plate 92 and the piezoelectric actuator 88. The fixed arm portion 90 consists of a vertical portion 94 and a horizontal portion 96 and is L-shaped as a whole. The upper end of the vertical portion 94 is connected and secured to the lower surface of the base plate 12, while the front end of the horizontal portion 96 faces the center of the processing container 46. The front end of the horizontal portion 96 lies slightly outside the trajectory of the vertical movement of the cap 62 so that the front end will not interfere (collide) with the vertically moving cap 62.

The fixed arm portion 90 is formed of a metal such as stainless steel. The slide plate 92 is provided on the horizontal portion 96 of the fixed arm portion 90 slidably in a direction toward the center of the processing container 46. In particular, as shown in FIG. 5, a guide rail 96A, having an inverted triangle-like cross-sectional shape, is provided on the upper surface of the horizontal portion 96, while an engagement groove 92A which engages the guide rail 96A is provided in the lower surface of the slide plate 92. The slide plate 92, which is thus in engagement with the horizontal portion 96, is allowed to move horizontally but not allowed to move vertically.

Each pressing mechanism 86 is designed to withstand a load of hundreds of kilograms. The slide plate 92 is movable horizontally by means of a drive section 98 provided in the fixed arm portion 90. The piezoelectric actuator 88 is provided on the upper surface at the front end of the slide plate 92. The piezoelectric actuator 88 expands vertically e.g. a few millimeters when applying an electric current to it. When the slide plate 92 is moved toward the center of the processing container 46, the piezoelectric actuator 88 comes to a position just below the cap 62.

A piezoelectric element stack 100 of a plurality of, for example 20, piezoelectric elements 100a can be used as the piezoelectric actuator 88. The piezoelectric actuator 88 can exert a large force though its stroke is short. The overall operation of the thus-constructed processing system 2 is controlled by a system control section comprised of a not-shown computer, etc.

The operation of the thus-constructed processing system of the present invention will now be described. The loading chamber 70 is filled with nitrogen gas which is an inert gas, and the oxygen concentration of the in-chamber atmosphere is set to be not more than a certain value.

A plurality of substrates W which have undergone the preceding processing are housed in a substrate container 22 filled with nitrogen gas, an inert gas, and the substrate container 22 is placed on the carry-in/carry-out port 24 at the front of the processing system 2. After opening the door 26 at the carry-in/carry-out port 24, the substrate container 22 on the carry-in/carry-out port 24 is held by the container transport arm 36 of the container transfer mechanism 32 and carried into the stocker unit 8.

The substrate container 22 is then placed on one of the stock shelves 30 for temporary storage. The substrate container 22, upon its turn for processing, is transferred by means of the container transfer mechanism 32 and placed on the container transfer port 38 provided on the central compartment wall 6. Upon the arrival of the substrate container 22 at the container transfer port 38, the door 40 at the substrate carry-in/carry-out opening 42 is opened.

Simultaneously with opening the door 40, the lid 22A of the substrate container 22 is detached by means of a lid opening/closing mechanism (not shown) provided at the substrate carry-in/carry-out opening 42 to open the interior of the substrate container 22 to the outside. In particular, the substrate container 22 on the container transfer port 38 is pressed by a not-shown actuator against the periphery of the substrate carry-in/carry-out opening 42 such that their interface becomes hermetically sealed, and then the lid 22A of the substrate container 22 and the door 40 in the loading chamber 70 are opened simultaneously.

Thereafter, all the substrates W in the substrate container 22 are transferred to the wafer boat 58 of the unloaded substrate holder 56 by means of the transfer arms 78 of the substrate transfer mechanism 72. By repeating the above operation, substrates W in a number of substrate containers 22 are transferred to the wafer boat 58 e.g. until it becomes fully loaded with substrates. When transferring substrates W to the wafer boat 58, the transfer arms 78 are moved vertically in the height direction of the wafer boat 58.

When the wafer boat 58 has become fully loaded with substrates W, the drive motor 80A of the lifting elevator mechanism 66 is actuated to raise the holding arm 82 and insert the wafer boat 58 into the processing container 46 in the processing unit 14 from below, thereby loading the substrates W into the processing container 46 as shown by the imaginary lines in FIG. 1.

When loading the wafer boat 58 into the processing container 46, the substrate holder 56 is not raised to the maximum height. Thus, as shown in FIG. 4(A), the cap 62 is raised until the peripheral portion of the cap 62 comes very close to or into slight contact with the flange portion 44A around the bottom opening 44 of the processing container 46. For example, the drive motor 80A may be actuated until the cap 62 comes into contact with the flange portion 44A at a low pressure.

When the cap 62 has come very close to the lower end of the processing container 46 as shown in FIG. 4(A), the drive motor 80A is stopped to stop the upward movement of the wafer boat 58. Next, as shown in FIG. 4(B), the slide plates 92 of the four pressing mechanisms 86, provided on the base plate 12, are simultaneously slid inward, i.e. toward the center of the processing container 46, as shown by the arrows 101, whereby the piezoelectric actuator 88, provided at the front end of each slide plate 92, comes to a position just below the peripheral portion of the cap 62.

Next, as shown in FIG. 4(C), an electric current is applied to the piezoelectric actuator 88 on each slide plate 92 to expand the piezoelectric element stack 100 of the piezoelectric elements 100a upwardly by a few millimeters as shown by the arrows 102. The upper end of the piezoelectric actuator 88 comes into contact with the lower surface of the peripheral portion of the cap 62 and presses against it upwardly with a strong force as shown by the arrows 102. The interface between the peripheral portion of the cap 62 and the flange portion 44A of the processing container 46 is sealed with the sealing member 64 interposed between them, whereby the processing container 46 is hermetically closed.

As described above, the load of the substrate holder 56, including the wafer boat 58 in which about 150 substrates having a diameter of 450 mm are housed, etc., can be about 400 kg. Therefore, when carrying out heat treatment at a processing pressure higher than atmospheric pressure, the total pressing force shown by the arrows 104 may be set e.g. at about 800 kg.

The substrate holder 56 including the wafer boat 58 is thus fully raised and loaded into the processing container 46 by the above operation, and the bottom opening 44 of the processing container 46 becomes hermetically closed by the cap 62. The load of the substrate holder 56 including the wafer boat 58 is received by the four pressing mechanisms 86, whereas almost no load is applied on the lifting elevator mechanism 66. Thus, it is not necessary to keep strongly pressing on the cap 62 by means of the lifting elevator mechanism 66 during heat treatment. Therefore, there is no need to make the structure of the lifting elevator mechanism 66 excessively strong, nor need to make the power of the drive motor 80A excessively high.

After thus making the processing container 46 hermetically closed, an intended heat treatment, e.g. film forming processing, of the substrates W which have been loaded into the processing container 46 is carried out by heating the substrates W to a processing temperature by means of the heating section 54 provided around the processing container 46, and supplying a processing gas(es) into the processing container 46 while maintaining a predetermined processing pressure, e.g. a pressure higher than atmospheric pressure by about 40 Torr.

After completion of the heat treatment of the substrates W, the processed substrates W are carried out of the processing container 46 by the reverse operation to the above-described operation. First, the application of electric current to the piezoelectric actuators 88 of the pressing mechanisms 86 is stopped to contract the piezoelectric actuators 88, and the slide plates 92 are moved laterally and outwardly from below the cap 62. The lifting elevator mechanism 66 is then driven to lower the holding arm 82, thereby withdrawing the substrate holder 56 including the wafer boat 58 from the processing container 46 and unloading the substrates W.

As described hereinabove, according to the present invention, in addition to the lifting elevator mechanism 66 for vertically moving the substrate holder 56, the pressing mechanisms 86, each having the piezoelectric actuator 88, for pressing against the cap 62 are provided in the loading unit configured to vertically move the substrate holder 56, holding a plurality of substrates W, into and out of the cylindrical processing container 46. This can avoid the need to increase the power of the lifting elevator mechanism 66, thus preventing an increase in the cost of the lifting elevator mechanism 66.

<Second Embodiment>

Figure 6:
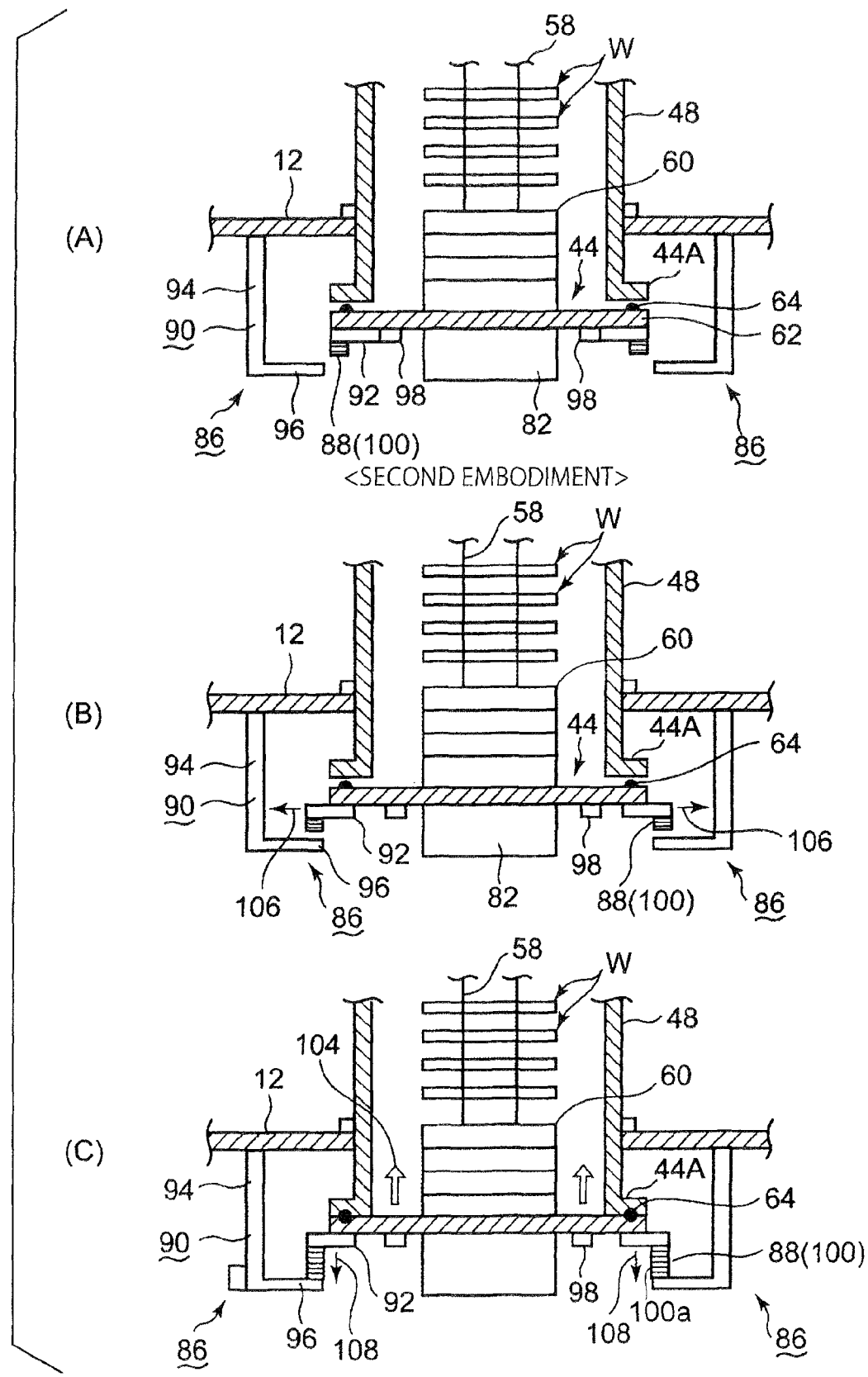
FIGS. 6(A) through 6(C) are diagrams illustrating the operation of a pressing mechanism according to a second embodiment.

A second embodiment of a pressing mechanism for use in the loading unit of the present invention will now be described. Though the slide pate 92 and the piezoelectric actuator 88 of the pressing mechanism 86 are provided in the fixed arm portion 90 in the above-described first embodiment, they may be provided on the lower surface of the cap 62. FIGS. 6(A) through 6(C) illustrate the operation of such a pressing mechanism according to a second embodiment. In the Figures, the same reference numerals are used for the same components or elements as those shown in FIGS. 1 through 5, and a description thereof will be omitted.

As shown in FIG. 6(A), in this embodiment the slide plate 92 and the piezoelectric actuator 88 of each pressing mechanism 86 are provided on the lower surface of the peripheral portion of the cap 62, and the slide plate 92 is slidable horizontally and outwardly in the radial direction of the cap 62 by means of the drive mechanism 98. The piezoelectric actuator 88 is provided on the lower surface of the front end of the slide plate 92 so that the piezoelectric actuator 88, when it is expanded, can make contact with the horizontal portion 96 of the fixed arm portion 90.

In operation, the cap 62 is raised and stopped when it comes close to or into slight contact with the flange portion 44A around the bottom opening 44 of the processing container 46, as shown in FIG. 6(A). Next, as shown in FIG. 6(B), the slide plates 92 are slid outwardly in the radial direction of the cap 62 as shown by the arrows 106. Next, as shown in FIG. 6(C), an electric current is applied to the piezoelectric actuator 88 on each slide plate 92 to expand it downwardly as shown by the arrows 108. The piezoelectric actuator 88 comes into contact with and presses against the horizontal portion 96 of the fixed arm portion 90. Then a counteractive upward pressing force acts on the cap 62 as shown by the arrows 104, whereby the processing container 46 is hermetically closed.

Also in this embodiment, the pressing mechanisms 86 can receive the heavy load of the substrate holder 56. Therefore, as with the first embodiment, there is no need to make the structure of the lifting elevator mechanism 66 excessively strong, nor need to make the power of the drive motor 80A excessively high.

<Third Embodiment>

Figure 7:
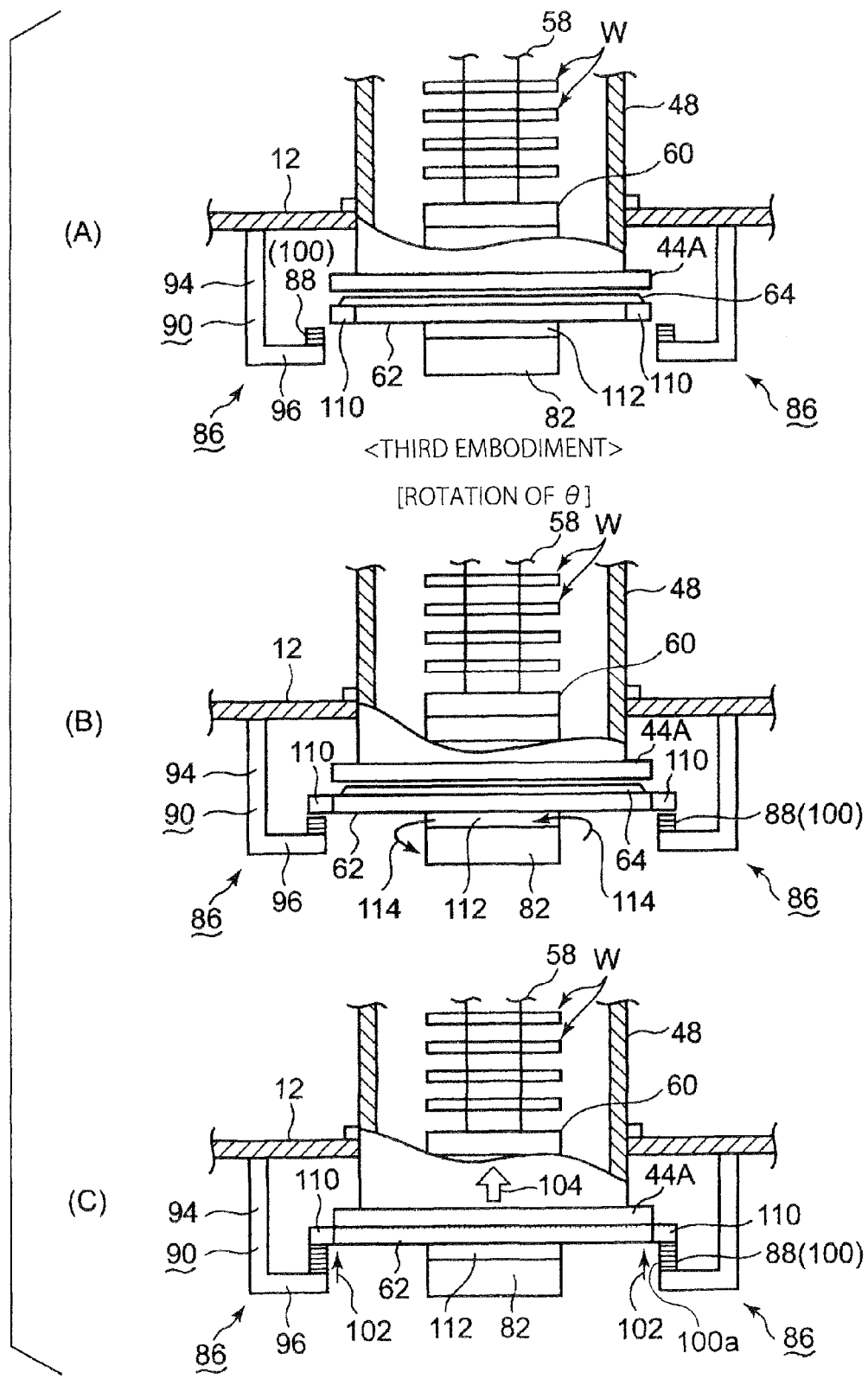
FIGS. 7(A) through 7(C) are diagrams illustrating the operation of a pressing mechanism according to a third embodiment.
Figure 8:
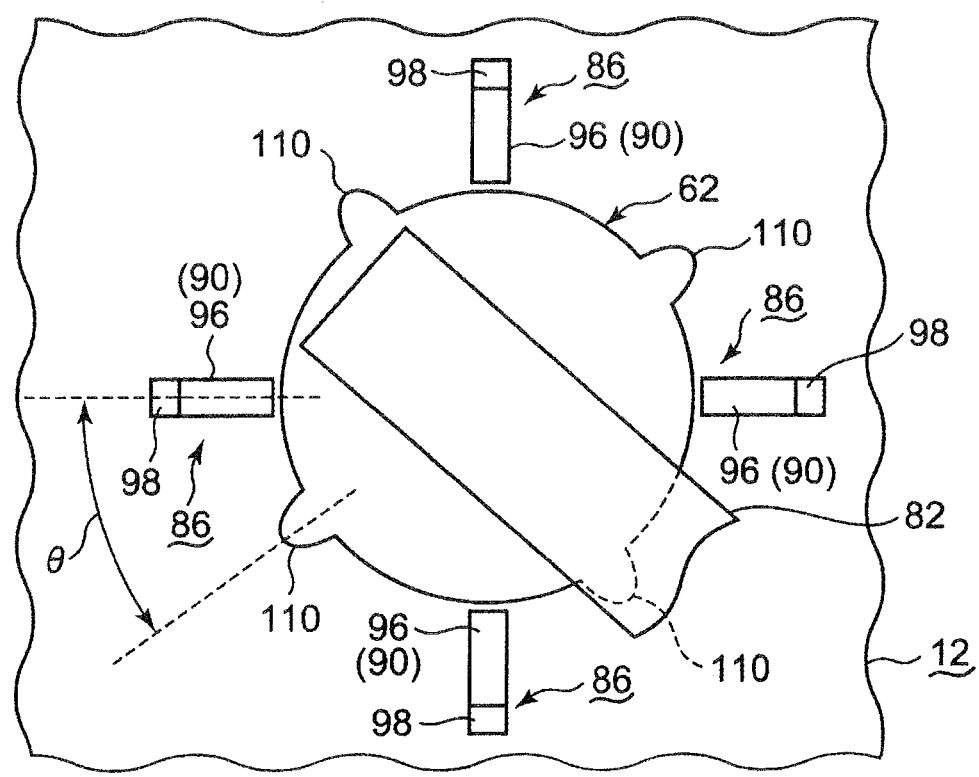
FIG. 8 is a bottom view showing the positional relationship between a raised cap and a pressing mechanism.

A third embodiment of a pressing mechanism for use in the loading unit of the present invention will now be described. Though in the above-described first and second embodiments the horizontally slidable slide plate 92 is provided in order to prevent its collision with the cap 62 moving up and down, it is also possible to provide a protruding press plate, having a similar function to that of the slide plate 92, in the cap 62. FIGS. 7(A) through 7(C) illustrate the operation of such a pressing mechanism according to a third embodiment; and FIG. 8 is a bottom view showing the positional relationship between the raised cap and the pressing mechanism. In the Figures, the same reference numerals are used for the same components or elements as those shown in FIGS. 1 through 6, and a description thereof will be omitted.

As shown in FIGS. 7(A) through 7(C), in this embodiment the fixed arm portion 90 of each pressing mechanism 86 is not provided with the slide plate 92, and the piezoelectric actuator 88 is directly secured to the horizontal portion 96. Further, as shown in FIG. 8, four protruding press plates 110, protruding outwardly in the radial direction of the cap 62, are provided at the periphery of the cap 62 each at a distance from the attachment position of each fixed arm portion 90 in the circumferential direction of the cap 62, the circumferential distance corresponding to a predetermined angle θ with respect to the center of the cap 62. The angle θ is such an angle as to prevent collision between each fixed arm portion 90 and the adjacent protruding press plate 110. Furthermore, a rotating table 112 is provided on the holding arm 82 of the lifting elevator mechanism 66 and the cap 62 is mounted on the rotating table 112 so that the cap 62 can be rotated in opposite directions through a certain angle, e.g. the angle θ.

In operation, the substrate holder 56 is loaded into the processing container 46 with each protruding press plate 110 lying at a distance, corresponding to the central angle θ, from the position of the adjacent fixed arm portion 90 in the circumferential direction of the cap 62. The cap 62 is raised and stopped when it comes close to or into slight contact with the flange portion 44A around the bottom opening 44 of the processing container 46, as shown in FIG. 7(A). The cap 62 is then rotated through the angle θ as shown by the arrows 114 in FIG. 7(B), thereby positioning each protruding press plate 110 at the same circumferential position as each fixed arm portion 90.

An electric current is then applied to the piezoelectric actuator 88 on each fixed arm portion 90 to expand the actuator 88 upwardly as shown by the arrows 102 in FIG. 7(C), thereby pressing on the protruding press plate 110 upwardly. Thus, the cap 62 is pressed on by the upward pressing force as shown by the arrow 104, whereby the processing container 46 is hermetically closed. The reverse operation to the above-described operation is performed when unloading the substrate holder 56 from the processing container 46.

Also in this embodiment, the pressing mechanisms 86 can receive the heavy load of the substrate holder 56. Therefore, as with the first embodiment, there is no need to make the structure of the lifting elevator mechanism 66 excessively strong, nor need to make the power of the drive motor 80A excessively high.

<Fourth Embodiment>

Figure 9:
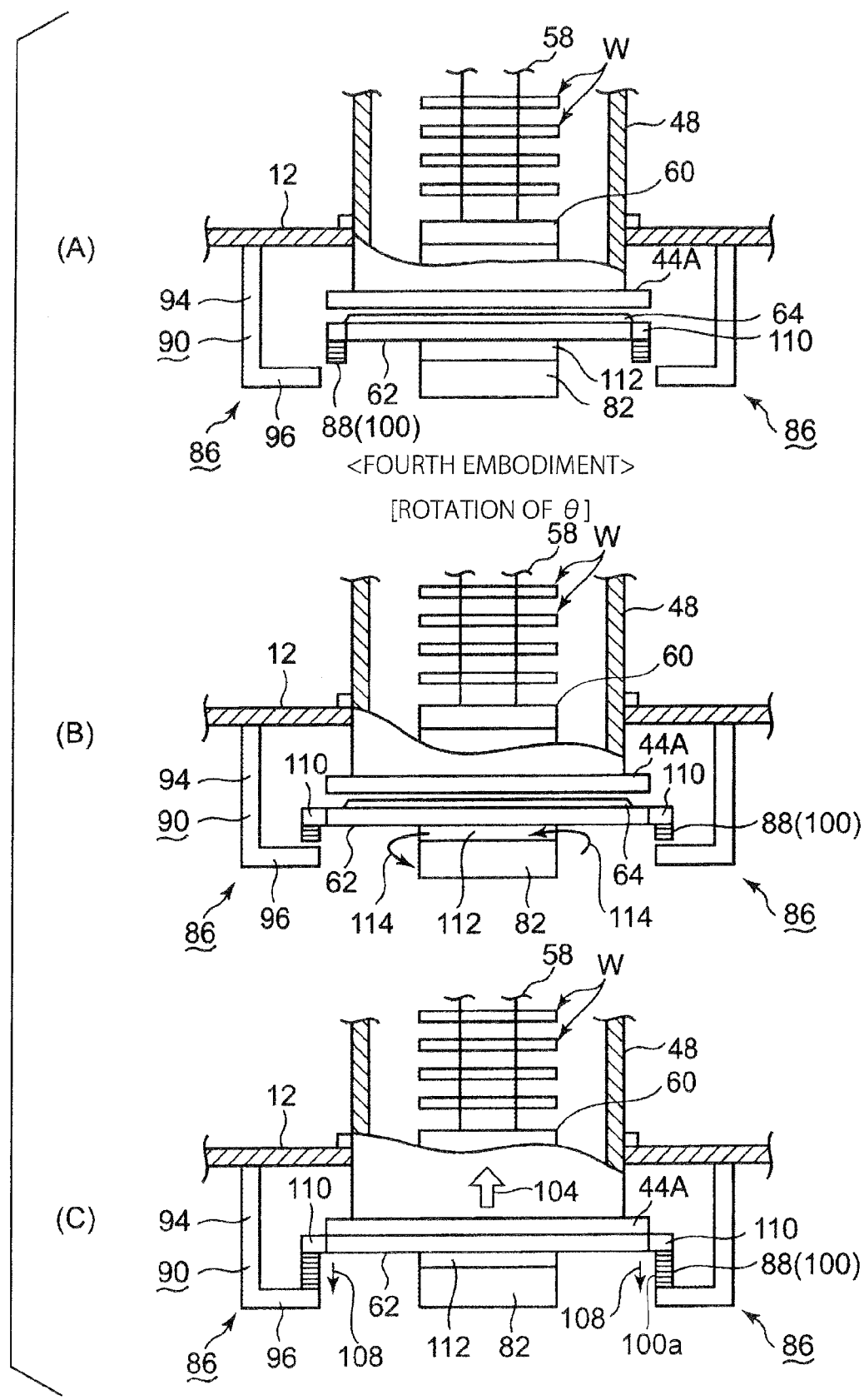
FIGS. 9(A) through 9(C) are diagrams illustrating the operation of a pressing mechanism according to a fourth embodiment.

A fourth embodiment of a pressing mechanism for use in the loading unit of the present invention will now be described. Though in the above-described third embodiment the piezoelectric actuator of each pressing mechanism is provided in the fixed arm portion, it is also possible to provide the piezoelectric actuator of each pressing mechanism in the cap. FIGS. 9(A) through 9(C) illustrate the operation of such a pressing mechanism according to a fourth embodiment. As shown in FIG. 9(A), the piezoelectric actuator 88 is not provided in the fixed arm portion 90, but secured to the lower surface of each protruding press plate 110 provided in the cap 62.

In operation, as in the third embodiment, the substrate holder 56 is loaded into the processing container 46 with each protruding press plate 110 lying at a distance, corresponding to the central angle θ, from the position of the adjacent fixed arm portion 90 in the circumferential direction of the cap 62 as shown in FIG. 8. The cap 62 is raised and stopped when it comes close to or into slight contact with the flange portion 44A around the bottom opening 44 of the processing container 46 as shown in FIG. 9(A). The cap 62 is then rotated through the angle θ as shown by the arrows 114 in FIG. 9(B), thereby positioning each protruding press plate 110 at the same circumferential position as each fixed arm portion 90.

An electric current is then applied to the piezoelectric actuator 88 on each protruding press plate 110 to expand the actuator 88 downwardly as shown by the arrows 108 in FIG. 9(C), thereby downwardly pressing on the horizontal portion 96 of each fixed arm portion 90. Thus, the cap 62 is pressed on by the counteractive upward pressing force as shown by the arrow 104, whereby the processing container 46 is hermetically closed. The reverse operation to the above-described operation is performed when unloading the substrate holder 56 from the processing container 46.

Also in this embodiment, the pressing mechanisms 86 can receive the heavy load of the substrate holder 56. Therefore, as with the first embodiment, there is no need to make the structure of the lifting elevator mechanism 66 excessively strong, nor need to make the power of the drive motor 80A excessively high.

<Fifth Embodiment>

Figure 10:
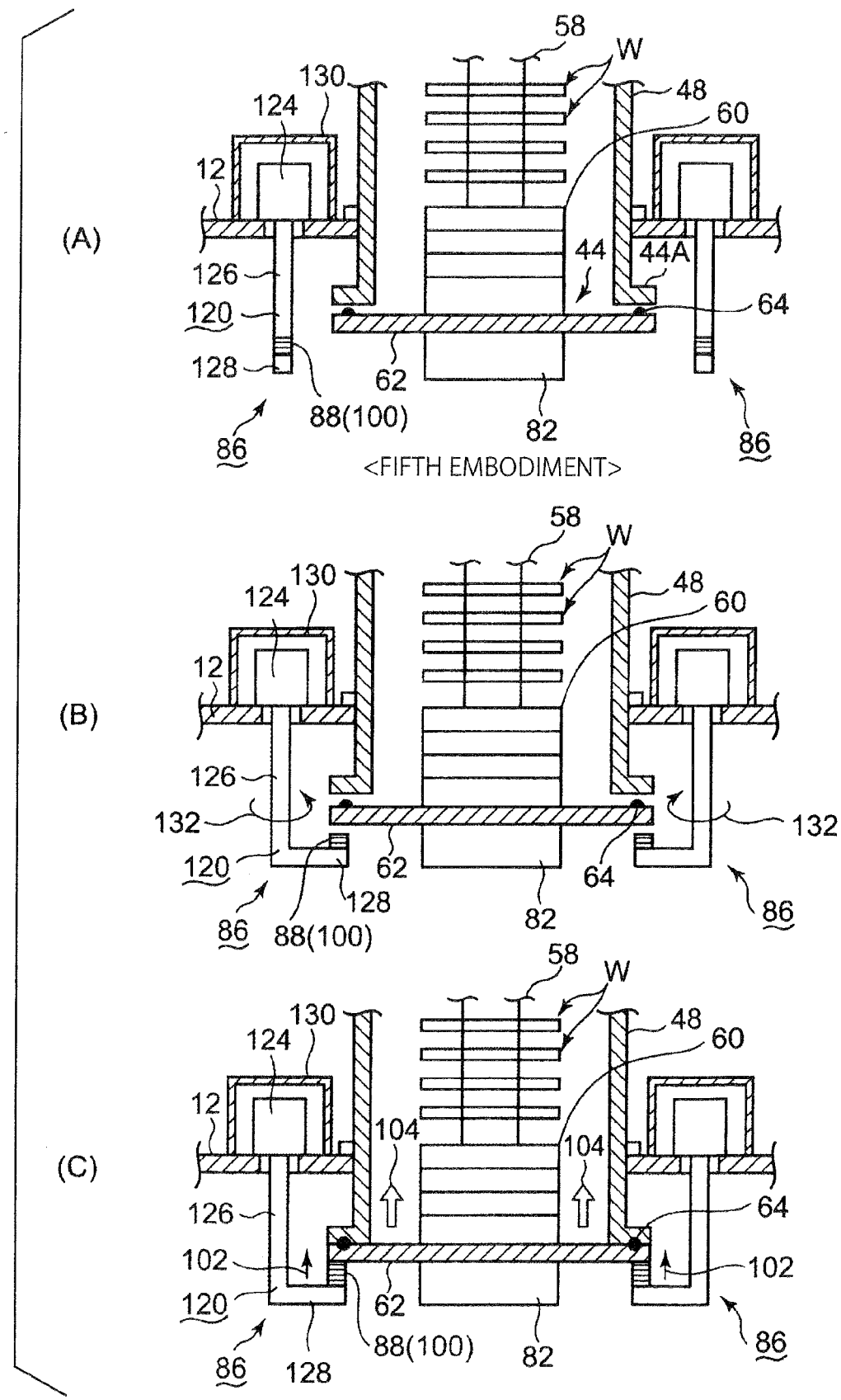
FIGS. 10(A) through 10(C) are diagrams illustrating the operation of a pressing mechanism according to a fifth embodiment.

A fifth embodiment of a pressing mechanism for use in the loading unit of the present invention will now be described. Though in the above-described first to fourth embodiments the fixed arm portion 90 is fixedly mounted to the base plate 12, it is also possible to pivotably mount an arm portion to the base plate 12. FIGS. 10(A) through 10(C) illustrate the operation of such a pressing mechanism according to a fifth embodiment. In the Figures, the same reference numerals are used for the same components or elements as those shown in FIGS. 1 through 9, and a description thereof will be omitted.

As shown in FIGS. 10(A) through 10(C), each pressing mechanism 86 of this embodiment has a pivot arm portion 120. As with the first embodiment, the pivot arm portion 120 is L-shaped and consists of a vertical portion 126 and a horizontal portion 128. The upper end of the vertical portion 126 of the pivot arm portion 120 is inserted through a mounting hole 122, formed in the base plate 12, and is coupled to and supported by a pivot actuator 124, so that the pivot arm portion 120 is pivotable about the vertical portion 126 as an axis. The entire pivot actuator 124 is hermetically covered with a sealing plate 130.

The horizontal portion 128, which is the front end portion of the pivot arm portion 120, is thus movable in a horizontal plane between a position just below the flange portion 44A of the processing container 46 and an outer position outside the flange portion 44A. The piezoelectric actuator 88 is secured to the front end of the horizontal portion 128.

In operation, the horizontal portion 128 of the pivot arm portion 120 is first positioned at the outer position, lying outside the position just below the flange portion 44A of the processing container 46, in order to avoid collision of the pivot arm portion 120 with the rising cap 62. The substrate holder 56 is then loaded into the processing container 46. Upon the loading, the cap 62 is raised and stopped when it comes close to or into slight contact with the flange portion 44A around the bottom opening 44 of the processing container 46, as shown in FIG. 10(A). The pivot arm portion 120 is then pivoted or rotated inwardly e.g. through 90 degrees as shown by the arrows 132 in FIG. 10(B), thereby positioning the piezoelectric actuator 88, provided on the horizontal portion 128, at the position just below the flange portion 44A and under the cap 62.

Next, an electric current is applied to the piezoelectric actuator 88 of each pivot arm portion 120 to expand the actuator 88 upwardly as shown by the arrows 102 in FIG. 10(C), thereby pressing on the protruding cap 62 upwardly. Thus, the cap 62 is pressed on by the upward pressing force as shown by the arrows 104, whereby the processing container 46 is hermetically closed. The reverse operation to the above-described operation is performed when unloading the substrate holder 56 from the processing container 46.

Also in this embodiment, the pressing mechanisms 86 can receive the heavy load of the substrate holder 56. Therefore, as with the first embodiment, there is no need to make the structure of the lifting elevator mechanism 66 excessively strong, nor need to make the power of the drive motor 80A excessively high.

<Sixth Embodiment>

Figure 11:
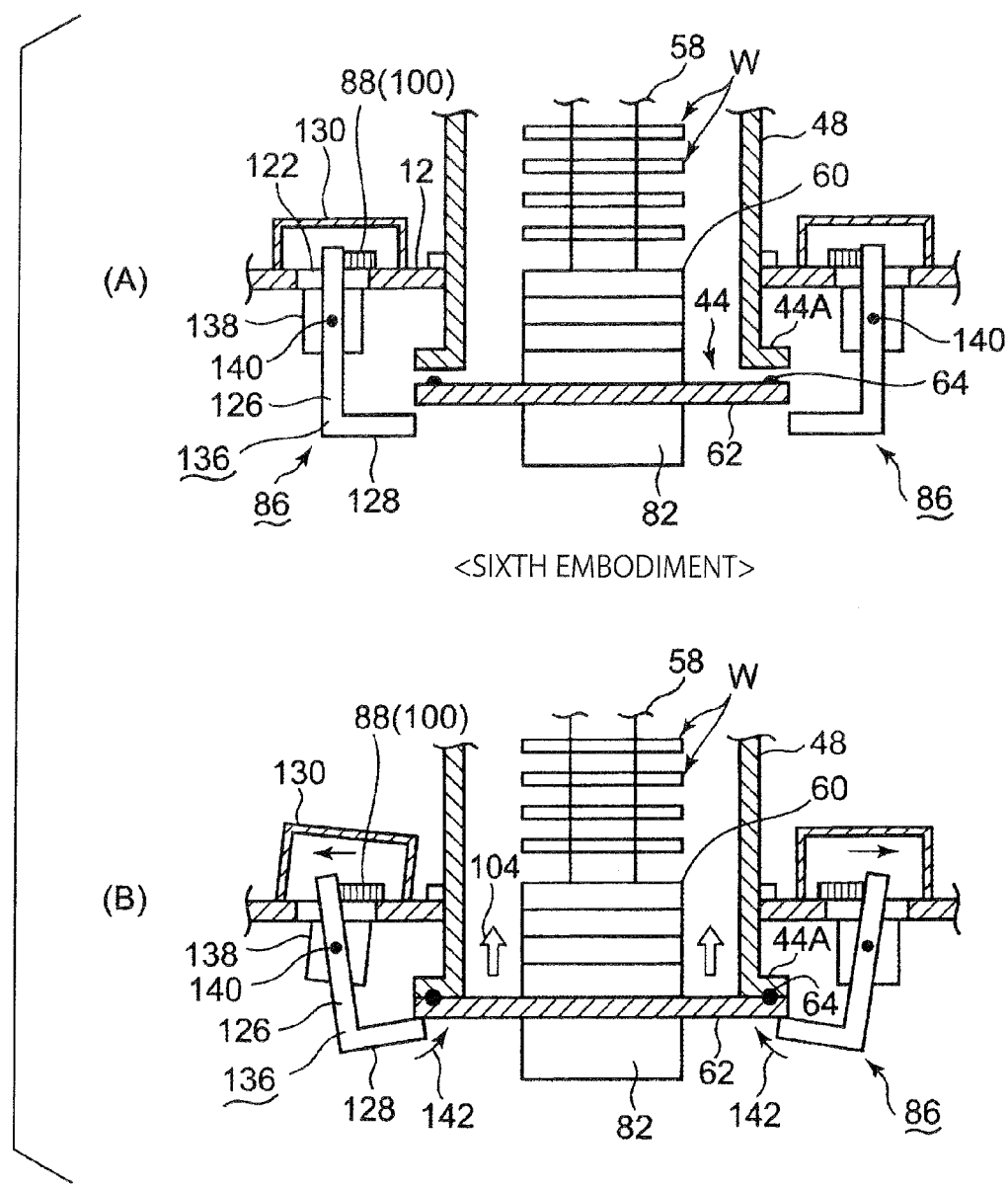
FIGS. 11(A) and 11(B) are diagrams illustrating the operation of a pressing mechanism according to a sixth embodiment.

A sixth embodiment of a pressing mechanism for use in the loading unit of the present invention will now be described. Though in the above-described first to fifth embodiments the piezoelectric actuator 88 directly makes contact with or is directly mounted to the cap 62 to press on it, it is also possible to use the piezoelectric actuator 88 to press on the cap 62 in an indirect manner. FIGS. 11(A) and 11(B) illustrate the operation of such a pressing mechanism according to a sixth embodiment. In the Figures, the same reference numerals are used for the same components or elements as those shown in FIGS. 1 through 10, and a description thereof will be omitted.

As shown in FIGS. 11(A) and 11(B), the pressing mechanism 86 of this embodiment includes a L-shaped swing arm portion 136 consisting of a vertical portion 126 and a horizontal portion 128. The upper end of the vertical portion 126 of the swing arm portion 136 is inserted through a mounting hole 122 formed in the base plate 12. The central portion of the vertical portion 126 in the longitudinal direction is shaft-supported at a supporting point 140 on a mounting base 138 which extends downwardly from the base plate 12, and is swingable in a vertical plane. When the horizontal portion 128 of the swing arm portion 136 rotates or swings inwardly toward the opening 44 of the processing container 46, the front end of the horizontal portion 128 can make contact with the lower surface of the peripheral portion of the cap 62.

The piezoelectric actuator 88 is mounted between the base plate 12 and the base end of the swing arm portion 136, i.e. the upper end of the vertical portion 126, so that by expanding/contracting the piezoelectric actuator 88, the swing arm portion 136 swings on the supporting point 140 in a vertical plane. A sealing plate 130 is hermetically mounted to the base plate 12 such that it covers the piezoelectric actuator 88 and the mounting hole 122, thereby ensuring the air-tightness of the loading chamber 70.

In operation, the horizontal portion 128 of the swing arm portion 136 is first positioned at the outer position, lying outside the position just below the flange portion 44A of the processing container 46, in order to avoid collision of the swing arm portion 136 with the rising cap 62. The substrate holder 56 is then loaded into the processing container 46. Upon the loading, the cap 62 is raised and stopped when it comes close to or into slight contact with the flange portion 44A around the bottom opening 44 of the processing container 46, as shown in FIG. 11(A). An electric current is then applied to the piezoelectric actuator 88 of each swing arm portion 136 to expand the actuator 88, thereby swinging or rotating the pivot arm portion 136 inwardly on the supporting point 140 as shown by the arrows 142 in FIG. 11(B).

The front end of the horizontal portion 128 comes into contact with and presses against the lower surface of the cap 62. Thus, the cap 62 is pressed on by the upward pressing force as shown by the arrows 104, whereby the processing container 46 is hermetically closed. The reverse operation to the above-described operation is performed when unloading the substrate holder 56 from the processing container 46.

Also in this embodiment, the pressing mechanisms 86 can receive the heavy load of the substrate holder 56. Therefore, as with the first embodiment, there is no need to make the structure of the lifting elevator mechanism 66 excessively strong, nor need to make the power of the drive motor 80A excessively high.

Figure 12:
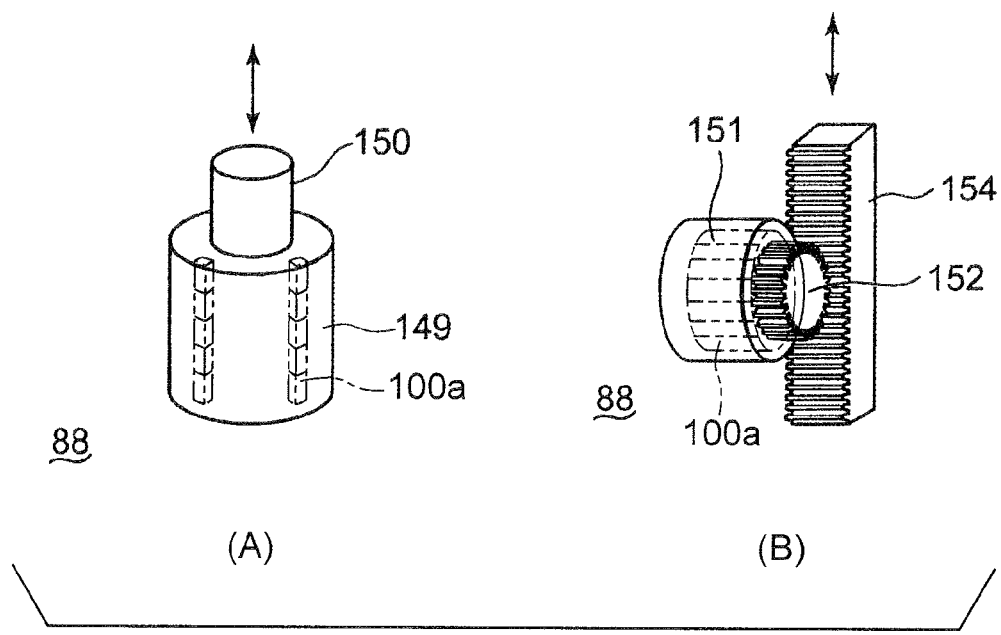
FIGS. 12(A) and 12(B) are schematic perspective views showing other exemplary piezoelectric actuators.

Though the piezoelectric element stack 100 of a plurality of piezoelectric elements 100a as disclosed e.g. in Japanese Patent Laid-Open Publication No. H04-370987 is used as the piezoelectric actuator 88 in the above-described embodiments, it is possible to use other types of piezoelectric actuators 88, such as the ones shown in FIGS. 12(A) and 12(B). FIGS. 12(A) and 12(B) are schematic perspective views showing other exemplary piezoelectric actuators.

The piezoelectric actuator 88 shown in FIG. 12(A) includes an ultrasonic linear motor having a cylindrical body 149 housing a plurality of piezoelectric elements 100a, and a movable body 150 in contact with the piezoelectric elements 100a, as disclosed e.g. in Japanese Patent Laid-Open Publication No. H07-046868. The movable body 150 is driven by a frictional force. The piezoelectric actuator 88 shown in FIG. 12(B) includes an ultrasonic rotary motor 151 having a rotator which uses a plurality of piezoelectric elements 100a and which is provided with a pinion 152, and a movable body 154 comprised of a rack in engagement with the pinion 152, as disclosed e.g. in Japanese Patent Laid-Open Publication No. H11-220894. The movable body 154 is movable vertically or horizontally.

The movable body 150 or 154 is moved horizontally or vertically to apply a pressing force on the cap 62. When an ultrasonic linear motor or an ultrasonic rotary motor is used as the piezoelectric actuator 88, a large frictional force is produced between a piezoelectric element(s) and a movable body or a rotator. Such a piezoelectric actuator 88 can therefore maintain a large pressing force even when the application of electric current to piezoelectric elements is stopped. In addition, the movable body 150 or 154 can move a long distance.

While heat treatment of substrates having a diameter of 450 mm has been described, the present invention of course is applicable to a processing system for substrates having a different diameter, for example, 300 mm.

Though in the above-described embodiments the fixed arm portion 90 is secured to the base plate 12, the fixed arm portion 90 may be secured to any portion of the chassis 4 of the processing system. For example, the fixed arm portion 90 may be secured to the rear compartment wall 10 or the central compartment wall 6. Alternatively, a vertically-extending fixed arm portion may be secured to the bottom compartment wall 18. Alternatively, the fixed arm portion 90 may be secured to a scavenger compartment wall that surrounds the opening 44 of the processing container 46. The fixed arm portion 90 may not necessary be L-shaped and may have any shape insofar as it has a horizontal portion 96 on which a piezoelectric actuator 88 is provided or which makes contact with a piezoelectric actuator 88.

Semiconductor wafers, usable as objects to be processed in the present invention, include a silicon substrate and a compound semiconductor substrate, such as a GaAs, SiC or GaN substrate. The present invention can also be applied to other substrates, such as a glass or ceramic substrate for use in a liquid crystal display device.

What is claimed is:

1. A loading unit for housing a substrate holder for holding plurality of substrates and a cap for supporting the substrate holder, and vertically moving the substrate holder and the cap into and out of a cylindrical processing container having a bottom opening to be closed by the cap, said loading unit comprising:
    a lifting elevator mechanism configured to hold and vertically move the substrate holder and the cap; and
    a pressing mechanism, having a piezoelectric actuator, configured to upwardly press against the cap lying at the bottom opening of the processing container,
    wherein the pressing mechanism is arranged independently from the lifting elevator mechanism and assists the lilting elevator mechanism in upwardly moving the substrate holder and the cap,
    wherein the pressing mechanism includes a fixed arm portion, and a slide plate provided in the fixed arm portion and configured to be horizontally movable below the cap positioned at the opening, and wherein the piezoelectric actuator is provided on the slide plate and is capable of pressing against the cap.

2. A loading unit for housing a substrate holder for holding a plurality of substrates and a cap for supporting the substrate holder, and vertically moving the substrate holder and the cap into and out of a cylindrical processing container having a bottom opening to be closed by the cap, said loading unit comprising:
    a lifting elevator mechanism configured to hold and vertically move the substrate holder and the cap; and
    a pressing mechanism, having a piezoelectric actuator, configured to upwardly press against the cap lying at the bottom opening of the processing container,
    wherein the pressing mechanism is arranged independently from the lifting elevator mechanism and assists the lifting elevator mechanism in upwardly moving the substrate holder and the cap,
    wherein the pressing mechanism includes a fixed arm portion, and a slide plate provided on the lower surface of the cap and configured to be horizontally movable outwardly from a peripheral portion of the cap, and wherein the piezoelectric actuator is provided on the slide plate and is capable of pressing against the fixed arm portion.

3. A loading unit for housing a substrate holder holding a plurality substrates and a cap for supporting the substrate holder, and vertically moving the substrate holder and the cap into and out of a cylindrical processing container having a bottom opening to be closed by the cap, said loading unit comprising:
    a lifting elevator mechanism configured to hold and vertically move the substrate holder and the cap; and
    a pressing mechanism, having piezoelectric actuator, configured to upwardly press against the cap lying at the bottom opening of the processing container,
    wherein the pressing mechanism is arranged independently from the lifting elevator mechanism and assists the lifting elevator mechanism in upwardly moving the substrate holder and the cap,
    wherein the cap is supported rotatably through a predetermined angle with respect to the lifting elevator mechanism, wherein the pressing mechanism includes a fixed arm portion, and a protruding press plate provided in the cap and protruding outwardly in the radial direction of the cap, and wherein the piezoelectric actuator is provided on the fixed arm portion and is capable of pressing against the protruding press plate.

4. A loading unit for housing a substrate holder for holding a plurality of substrates and a cap for supporting the substrate holder, and vertically moving the substrate holder and the cap into and out of cylindrical processing container having a bottom opening to be closed by the cap, said loading unit comprising:
    a lifting elevator mechanism configured to hold and vertically move the substrate holder and the cap; and
    a pressing mechanism, having a piezoelectric actuator, configured to upwardly press against the cap lying at the bottom opening of the processing container,
    wherein the pressing mechanism is arranged independently from the lifting elevator mechanism and assists the lifting elevator mechanism in upwardly moving the substrate holder and the cap,
    wherein the cap is supported rotatably through a predetermined angle with respect to the lifting elevator mechanism, wherein the pressing mechanism includes a fixed arm portion, and a protruding press plate provided in the cap and protruding outwardly in the radial direction of the cap, and wherein the piezoelectric actuator is provided on the protruding press plate and is capable of pressing against the fixed arm portion.

5. A loading unit for housing, a substrate holder for holding a plurality of substrates and a cap for supporting the substrate holder, and vertically moving the substrate holder and the cap into and out of a cylindrical processing container having a bottom opening to be closed by the cap, said loading unit comprising:
    a lifting elevator mechanism configured to hold and vertically move the substrate holder and the cap; and
    a pressing mechanism, having a piezoelectric actuator, configured to upwardly press against the cap lying at the bottom opening of the processing container,
    wherein the pressing mechanism is arranged independently from the lifting elevator mechanism and assists the lifting elevator mechanism in upwardly moving the substrate holder and the cap,
    wherein the pressing mechanism includes a pivot arm portion supported pivotably such that a front end of the pivot arm moves between a position below the opening of the processing container and an outer position, and wherein the actuator is provided at the front end of the pivot arm portion and is capable of pressing against the cap positioned at the opening.

6. A loading unit for housing a substrate holder for holding a plurality of substrates and a cap for supporting the substrate holder, and vertically moving the substrate holder and the cap into and out of a cylindrical processing container having a bottom opening to be closed by the cap, said loading unit comprising:
- a lifting elevator mechanism configured to hold and vertically move the substrate holder and the cap; and
- a pressing mechanism, having a piezoelectric actuator, configured to upwardly press against the cap lying at the bottom opening of the processing container,
- wherein the pressing mechanism is arranged independently from the lifting elevator mechanism and assists the lifting elevator mechanism in upwardly moving the substrate holder and the cap,
- wherein the pressing mechanism includes a swing arm portion supported swingably in a vertical plane so that a front end of the swing arm can make contact with the cap positioned at the opening, and wherein the actuator is configured to press against the base end of the swing arm portion.

* * * * *